(12) United States Patent
Shiode et al.

(10) Patent No.: US 7,221,434 B2
(45) Date of Patent: May 22, 2007

(54) EXPOSURE METHOD AND APPARATUS

(75) Inventors: Yoshihiro Shiode, Utsunomiya (JP); Seiya Miura, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/365,045

(22) Filed: Feb. 28, 2006

(65) Prior Publication Data
US 2006/0268255 A1 Nov. 30, 2006

(30) Foreign Application Priority Data
Mar. 1, 2005 (JP) ............... 2005-056198

(51) Int. Cl.
  G03B 27/62 (2006.01)
  G03B 27/52 (2006.01)
  G03B 27/32 (2006.01)
(52) U.S. Cl. ............... 355/75; 355/55; 355/77
(58) Field of Classification Search ........... 355/52, 355/55, 67, 72, 75; 250/548; 356/399–401; 430/5, 20, 30
See application file for complete search history.

(56) References Cited

U.S. PATENT DOCUMENTS

| | | | |
|---|---|---|---|
| 5,640,227 A * | 6/1997 | Kato et al. ............... 355/53 |
| 6,262,792 B1 | 7/2001 | Higashiki |
| 6,738,128 B2 * | 5/2004 | Shima et al. ............... 355/52 |
| 6,813,001 B2 * | 11/2004 | Fujisawa et al. ............... 355/53 |
| 6,844,123 B1 * | 1/2005 | Ekberg et al. ............... 430/30 |
| 6,982,786 B2 * | 1/2006 | Shiode ............... 356/121 |
| 2002/0015158 A1 | 2/2002 | Shiode et al. |
| 2003/0133099 A1 | 7/2003 | Shiode |
| 2003/0197848 A1 | 10/2003 | Shiraishi |

FOREIGN PATENT DOCUMENTS

| | | |
|---|---|---|
| JP | 9-180989 | 7/1997 |
| JP | 2002-289494 | 10/2002 |
| WO | 02/43123 A1 | 5/2002 |
| WO | 03/021352 | 3/2003 |

* cited by examiner

*Primary Examiner*—Henry Hung Nguyen
(74) *Attorney, Agent, or Firm*—Morgan & Finnegan LLP

(57) ABSTRACT

An exposure method for an exposure apparatus that exposes a mask pattern onto a plate using a projection optical system includes the steps of obtaining information about flatness of a first mask, condition of an image plane when projecting a pattern of the first mask by using the projection optical system, information about a driving amount of a driving system, which can change an imaging condition on the plate based on the condition of the image plane, and information about flatness of a second mask, changing information about the driving amount by using information about flatness of the first and second masks, and driving the driving system based on changed information about the driving amount of the driving system to project a pattern of the second mask onto the plate using the projection optical system.

7 Claims, 13 Drawing Sheets

EXPOSURE METHOD AND APPARATUS

BACKGROUND OF THE INVENTION

The present invention relates generally to an exposure method, and more particularly to a measurement of a change in shape of a mask (or a reticle) on which a pattern is formed that is transferred to a plate via a projection optical system. The exposure method and apparatus of this invention is suitable for an exposure method and apparatus that corrects an aberration in a projection optical system and a focus position based on information about mask's flatness.

In manufacturing a semiconductor device and the like using a photo-lithography process, a projection exposure apparatus has been used that transfers a pattern of a mask to a target. Such exposure apparatus is required to precisely transfer a mask pattern onto the target, and should use an aberration reduced projection optical system for exposure at the best focus position. Further, due to the recent demand for a higher resolution, the projection optical system's numerical aperture (NA) increases. Thus, the depth of focus consequently lowers, and driving correction based on a mask's flatness becomes necessary.

One means to measure the mask's flatness is to optically detect a surface position is known (e.g., see Japanese Patent Application, Publication No. 9-180989 and PCT International Patent Application No. 2/43123 pamphlet). If such a means is installed on an exposure apparatus to measure the mask's flatness prior to exposure, the result can be fed back to correct a driving amount for driving a driving system (a wafer stage, a mask stage, etc.), and field curvature of a projector lens, which will assure highly precise exposure.

The focus condition and field curvature corrected based on an optically detected result may contain aberrations, and need corrections based on an actual exposure result. As an example of such a correction method, there is a phase-shift focus monitor (PSFM) technique available for use (See the Internet URL: http://www.benchmarktech.com/PSFM.htm.) In addition, a phase grating focus monitor (PGFM) is available (see "New phase shift gratings for measuring aberrations" by H. Nomura, SPIE. Vol. 4346 (2001), pp. 25–35.) A Z-SPIN method and others are also proposed. See, e.g., Japanese Patent Application, Publication No. 2002-289494 and PCT International Patent Application No. 03/021352. In these correction methods, a mask having a measurement pattern (hereinafter called "a focus monitor mask) is used that differs from the one used for an actual device mask (a mask used when actually manufacturing a semiconductor device and the like). Measuring a position-shifting of a pattern finds the best focus position and field curvature. For a step-and-scan exposure apparatus (i.e., a scanner) that requires a shorter inspection time and higher correction accuracy because it has many measuring points, these correction methods have the characteristics of monitoring focus changes during scanning, and the like. Accordingly, it is effective to use them in adjusting the position of an image plane (scan field curvature) related to a lens' field curvature of an apparatus and a change in posture during scanning.

A mask flatness measuring means uses a measuring optical system, and requires that the measuring optical system's original point be corrected. For correction of the original point, a flat plate that assures absolute flatness is typically used as a base, but in scanning exposure, the measuring optical system varies because it is in driving motion, and the original point also varies. Because of such variation errors and other errors, a measurement result obtained by using a focus monitor mask (e.g., a scan field curvature) and the one obtained by using an actual device mask do not necessarily agree. Further, due to a requirement for more minute devices, etc. in recent years, the impact of the errors on the imaging performance has become non-negligible.

BRIEF SUMMARY OF THE INVENTION

The present invention is directed to an exposure method and apparatus that can precisely measure an actual device mask's flatness using a focus monitor mask.

An exposure method as one aspect of this invention is an exposure method used for an exposure apparatus that exposes a pattern of a mask onto a plate by using a projection optical system includes the steps of obtaining information about flatness of a first mask, obtaining condition of an image plane when projecting a pattern of the first mask by using the projection optical system, obtaining information about a driving amount of a driving system in the exposure apparatus, which can change an imaging condition on the plate based on the condition of the image plane, obtaining information about flatness of a second mask, changing information about the driving amount of the driving system by using information about flatness of the first mask and the information about flatness of the second mask, and driving the driving system based on changed information about the driving amount of the driving system to project a pattern of the second mask onto the plate by using the projection optical system.

An exposure apparatus having a mode that performs such an exposure method constitutes another aspect of this invention. A device manufacturing method as another aspect of this invention includes the steps of exposing a plate by using the above mentioned exposure apparatus, and developing the plate. Claims for a device fabrication method for performing operations similar to those of the above exposure apparatus cover devices as intermediate and final products. Such devices include semiconductor chips like an LSI and VLSI, CCDs, LCDs, magnetic sensors, thin film magnetic heads, and the like.

Other objects and further features of the present invention will become readily apparent from the following description of the preferred embodiments with reference to accompanying drawings.

DETAILED DESCRIPTION OF THE PREFERRED EMBODIMENTS

Figure 1:
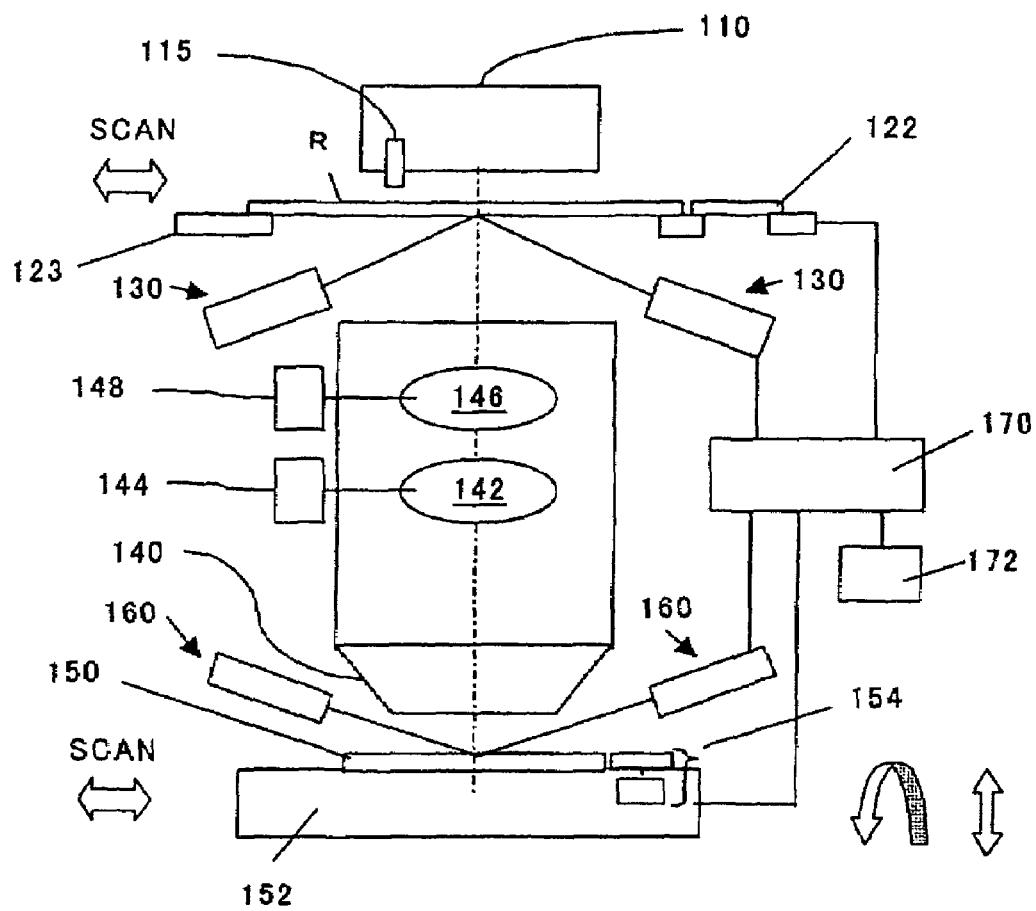
FIG. 1 is a schematic block diagram of an exposure apparatus as an aspect of this invention.

A description will now be given of an exposure method and apparatus as embodiments of this invention referring to accompanying drawings. Here, FIG. 1 is a schematic block diagram of an exposure apparatus 100. As shown in FIG. 1, the exposure apparatus 100 has an illumination apparatus 110, a mask stage 123, a projection optical system 140 and a wafer stage 152. Further, the exposure apparatus 100 also has a scope 115, a mask flatness measuring unit 130, a wafer surface position detector 160, a controller 170, and a memory 172.

A mask R can be loaded (mounted) on the mask stage 123. As a mask R, various kinds of masks are available such as an actual device mask 120 and a focus monitor mask 124 described later. On the mask stage 123, there is provided a plane (reference surface) 122 as a basis for the flatness measuring unit 130.

A wafer 150 can be loaded on the wafer stage 152. A stage reference mark 154 is provided on the wafer stage 152.

The exposure apparatus 100 of this embodiment is a scanner, but the step-and-repeat exposure mode or other exposure modes may be applied.

The illumination apparatus 110 has a light source (not shown) and an illumination optical system, illuminating the mask 120 on which a circuit pattern to be transferred is formed. For the light source, e.g., an ArF excimer laser with a wavelength of about 193 nm, a KrF excimer laser with a wavelength of about 248 nm, an $F_2$ laser with a wavelength of about 153 nm, and others can be used. The illumination optical system is an optical system that illuminates the mask 120, including a lens, a mirror, a light integrator, a stop, etc. In this embodiment, the illumination optical system illuminates an exposure area on a specific slit.

The scope 115 is an alignment scope used for aligning the positions of the mask and the wafer, but it can also be used as a light source in place of exposure light in the Z-SPIN method described later.

A pattern to be transferred is formed on the mask R, which is supported and driven by the mask stage 123. Diffracted light emitted from the mask R goes through the projection optical system 140, being projected onto the wafer 150. The mask R and the wafer 150 are arranged in an optically conjugate relationship. Since the exposure apparatus 100 is a scanner, the mask R and the wafer 150 are scanned synchronously, thereby transferring the pattern on the mask R onto the wafer. In the meantime, if it is a step-and-repeat exposure apparatus (i.e., "a stepper"), the exposure operation is carried out with the mask R and the wafer 150 in a standing-still state.

The mask R is held on the mask stage 123 through vacuum contact via a mask holder (not shown) with the pattern-formed side down. The mask stage 123 is connected to a transfer mechanism (not shown). The mask stage 123 and the projection optical system 140 are installed on a supporting member supported, for example, via a damper on a base-frame placed on the floor and the like.

The focus monitor mask 124 is a mask different from the actual device mask 120, and is arbitrarily loaded onto the mask stage 123 in place of the actual device mask 120, as needed, to be used for calculating a correction amount for a driving system when exposing the actual device mask 120. For the focus monitor mask 124, the one whose flatness is managed is preferable, and is used in a correction step using the Z-SPIN, PSFM, PGFM, and the like. The focus monitor mask 124 is effective as a final homestretch means for handling an image plane shape. This can not only accurately assure an exposure result of an exposure operation with an actual exposure speed, but also rigorously calculate correction amounts for an optimum focus position, tilt position, and field curvature per scanning position from multi-point exposure results in a shot.

The projection optical system 140 has the function of image-forming the diffracted light having passed the pattern formed on the mask R onto the wafer 150. The projection optical system 140 may use an optical system solely composed of a plurality of lens elements, a catadioptric optical system comprised of a plurality of lens elements and at least one concave mirror, and the like.

The projection optical system 140 includes a first correction optical system 142 and a second correction optical system 146. The first correction optical system 142 is structured such that it is driven by a driving means 144, and is used to correct a field curvature. The second correction optical system 146 is structured such that it is driven by a driving means 148, and is used to correct other aberrations (such as a spherical aberration, an astigmatism, a coma aberration, and a distortion). In this embodiment, the first correction optical system 142 and the second correction optical system 146 are structured as separate bodies, but the two may be integrated.

In other embodiments, the wafer 150 may be replaced by a liquid crystal plate or other plates. On the wafer 150, a photo-resist is applied to the plate. The wafer 150 is held by the wafer stage 152. The wafer stage 152 can drive the wafer 150 in directions of X-Y-Z axes and in a tilt direction around these axes. To the stage 152, any structure can be applied that is known in the art such as using a linear motor and the like, and thus, a description of its detailed structure and operations is omitted here. The stage 152 can be installed on a supporting member supported on the floor and the like via, e.g., a damper.

The exposure apparatus 100 scans the mask R and the wafer 150 while they are synchronized by the controller 170. The positions of the mask stage 123 and the wafer stage 152 are monitored, e.g., by a laser interferometer and the like, and both are driven at a constant speed ratio.

A mask flatness detecting system 130 is installed on the mask pattern surface side. Similar to a wafer surface position detection unit 160 described later, the mask flatness detecting system 130 is composed of an oblique-incidence position detecting system, which irradiates non-exposure light from an oblique direction with respect to a measured target plane (in this case, an actual mask surface or a focus monitor mask surface), and detects light reflecting obliquely from the measured target plane. A detecting part of the oblique-incidence position detecting system is composed of multiple light acceptance elements for position detection corresponding to each reflecting ray of light, which are arranged such that the light acceptance surface of each light acceptance element and the reflection point of each ray of light are approximately conjugate. Therefore, a deformation amount of a mask surface (or of a focus monitor mask surface) is measured on the light acceptance elements in the detecting part as a position shifting.

Figure 2:
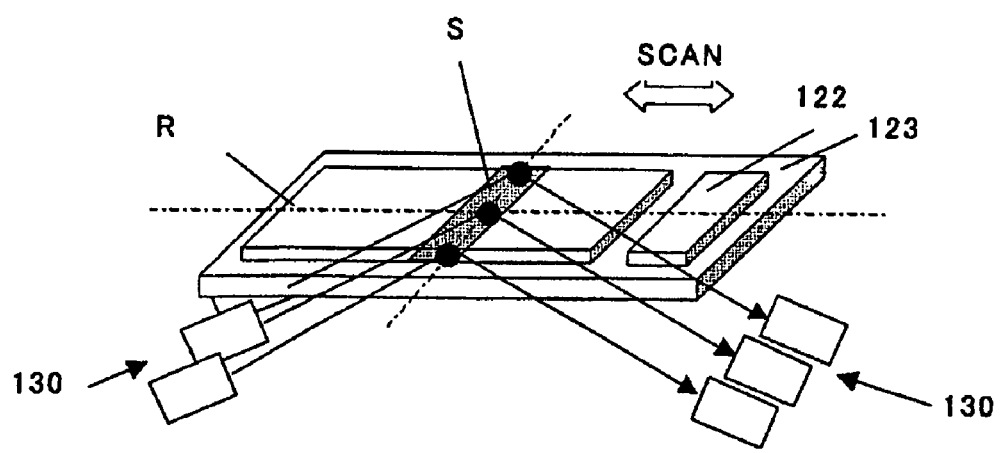
FIG. 2 is a schematic perspective diagram showing the details of measurement by a mask flatness measuring unit of the exposure apparatus shown in FIG. 1.

FIG. 2 is a schematic perspective diagram showing the details of detection by the mask flatness detecting system 130. As shown in the figure, three independent mask flatness detecting systems 130 are structured, for example, such that they are arranged in a direction perpendicular to the mask scanning direction (the slit S's longer direction) to scan and measure the shape of the mask surface. In short, this embodiment sets three measuring points in the slit's longer direction. Due to such a structure, the mask's deformation (change in shape) constituents (tilt and bending) in a direction orthogonal to the scanning direction are measured at the three measuring points. By scanning the mask stage 123 at a constant speed like the scanning exposure, and synchronizing the mask position and the measuring system at that time, it is possible to measure a deformation amount (flatness) at each position in the mask's scanning direction.

Similar to the aforementioned mask flatness detecting system 130, the wafer surface position detection unit 160 is comprised of an oblique-incidence position detection system. In the wafer surface position detection system 160, a position-shifting in a height direction of the wafer surface (or the reference mark surface) is measured on the light acceptance elements in the detecting part as a position-shifting.

The controller 170, which controls driving amounts for respective parts, is connected to the mask stage 123, the mask flatness measuring unit 130, the wafer stage 152, the wafer surface position detection unit 160, and the memory 172.

Figure 9:
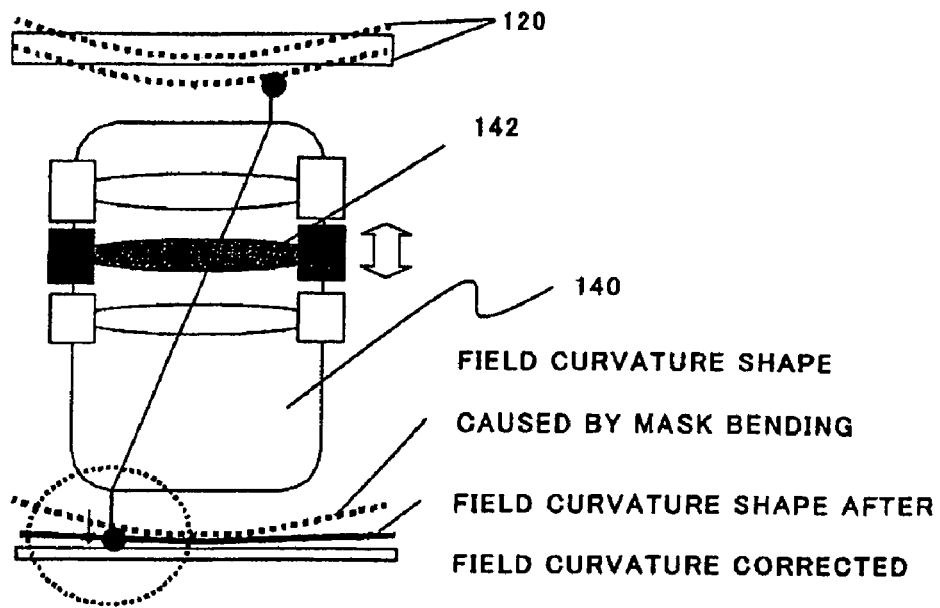
FIG. 9 is a diagram for explaining a correction method for a field curvature in a direction orthogonal to the scanning direction.

When correcting mask flatness, with respect to the mask's flatness in a direction at right angles with the scanning direction, e.g., when the mask bends, the controller 170 drives the correction optical system 142 via the driving means 144 as shown in FIG. 9. It generates a field curvature so that the mask bending may be canceled, and flattens the shape of the mask's imaging surface at the wafer side. Further, with respect to the mask flatness in the scanning direction, the controller 170 converts the correction amount at the mask side for the wafer side, and drives the wafer stage 152 for focusing and tilting, thus performing correction. The focus correction amount is determined by the projection optical system 140's image-forming magnification ratio, and for a ¼ demagnification optical system, setting $(1/4)^2$ times permits excellent correction. The tilt correction amount can be satisfactorily corrected by setting a $-1/4$ times. A focus and tilt correction driving mechanism may be installed on the mask stage 123 itself to enable correction to be made on the mask stage side. This has the advantage that the driving correction amount becomes large, but correction based on the driving error can be kept at a small scale on the wafer side. However, since driving mechanisms of the apparatus are on the increase, correction on the wafer side will be more effective in terms of keeping the equipment cost low.

Further, the controller 170 drives the wafer stage 152 based on the detection result from the wafer surface position detection system 160 and adjusts the wafer 150 to an optimum focus and tilt position per shot or slit.

Figure 3:
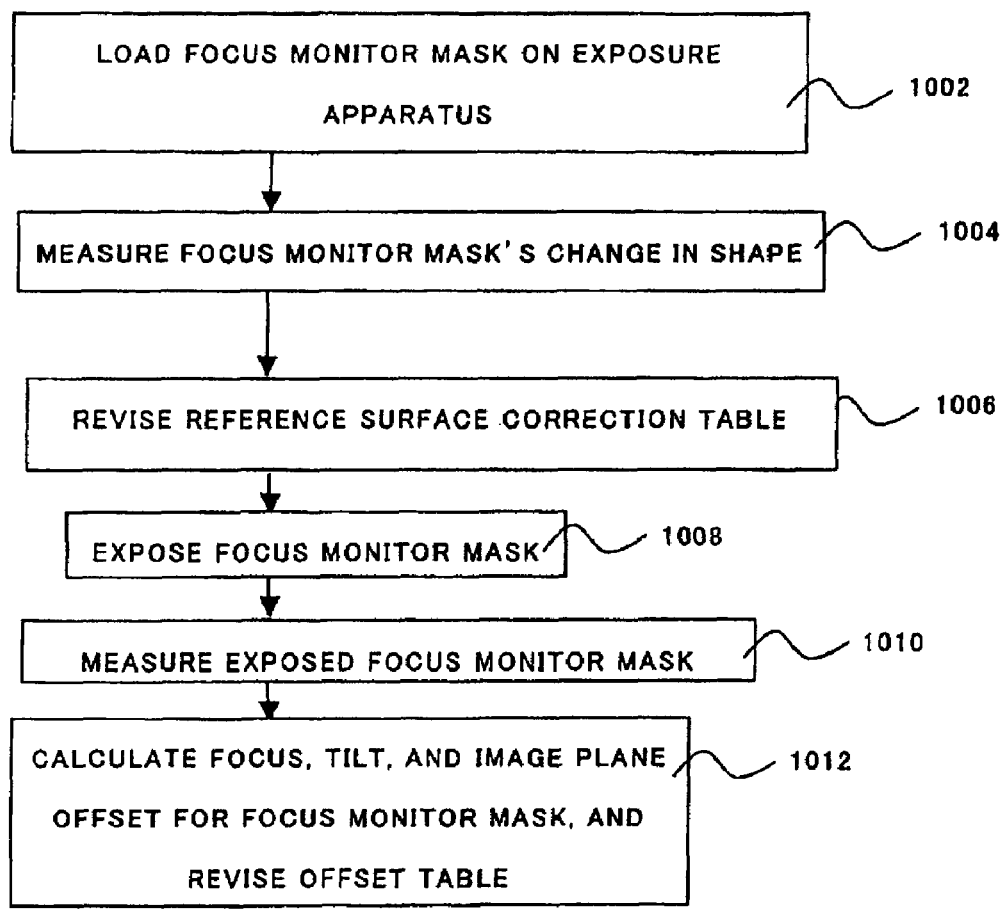
FIG. 3 is a flowchart of an exposure method performed by the exposure apparatus shown in FIG. 1.
Figure 4:
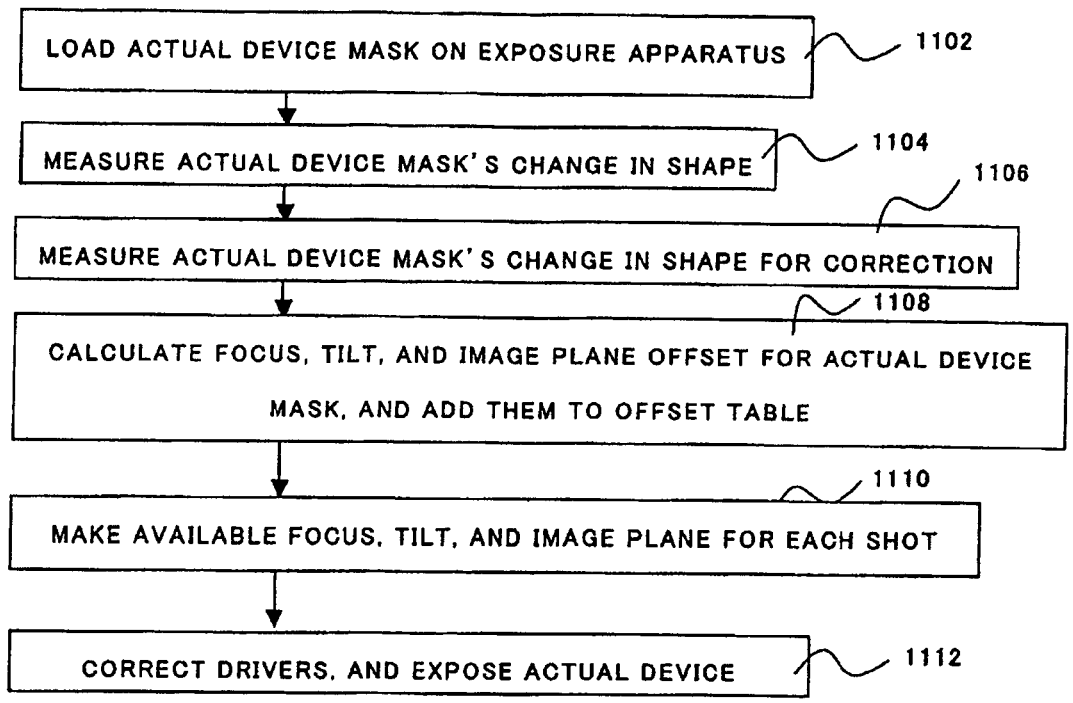
FIG. 4 is a flowchart of an exposure method performed by the exposure apparatus shown in FIG. 1.

The memory 172 stores the exposure method shown in FIGS. 3 and 4, a reference surface correct ion table, and an offset table.

Now, referring to FIGS. 3 and 4, a description will be given of the exposure method as an embodiment of this invention. Here, FIG. 3 is a flowchart for initially preparing a reference surface correction table and offset table described later by using the focus monitor mask 124.

At first, mount the focus monitor mask 124 onto the exposure apparatus 100 (more precisely, onto the mask stage 123) (Step 1002). Then, measure the mask flatness of the focus monitor mask 124 per scan position and optical measuring point by using the mask flatness measuring unit 130 (Step 1004). For the focus monitor mask 124, a mask for the Z-SPIN method is used in this embodiment.

The controller 170 gets a measured value (reference offset), obtained in Step 1004, from the mask flatness measuring unit 130 and stores it or revises a stored reference surface correction table with it (Step 1006). The reference surface is a plane 122 provided on the mask stage 123 of FIG. 2, which will be used as a reference for the flatness measuring unit 130.

The reference surface table needs to be updated, because the reference surface (the plane 122) is likely to change or deform when various units are mounted on the exposure apparatus body or due to variation with time. Accordingly, the surface reference table is corrected by using the flatness of the focus monitor mask 124 obtained by the mask flatness measuring unit 130.

Next, expose the wafer 150 using the focus monitor mask 124 (Step 1008). Meanwhile, such actual exposure is not necessarily required for this invention. For example, as in Japanese Patent Application, Publication No. 2002-289494 (Corresponds to: USAA2002015158), the focus monitor mask's image plane condition may be detected using a TTL (through the lens) image plane position measuring system 154.

Next, measure the result of exposing the focus monitor mask 124 (image plane condition) (Step 1010). Then, calculate the focus condition of the image plane, the tilt of the image plane, and the field curvature, and revise the offset table (Step 1012). The offset table is a table that determines an offset for a driving amount for a driving system (such as the wafer stage 152) at each scanning position on the mask. A pre-stored offset for a driving amount for a driving system is so revised as to become optimum for scanning-exposing the focus monitor mask 124. Namely, the offset is revised such that the scanning direction image plane shape developed in the wafer becomes an optimum image plane position, the correction optical system 142 is set at the optimum position, and the scanning direction image plane shape becomes optimum. The memory 172's storing such offset amounts enables the exposure apparatus 100 to form an optimum image plane for the focus monitor mask 124.

Here, a detail description will be given of exposing the focus monitor mask 124 by using the Z-SPIN method.

Figure 5:
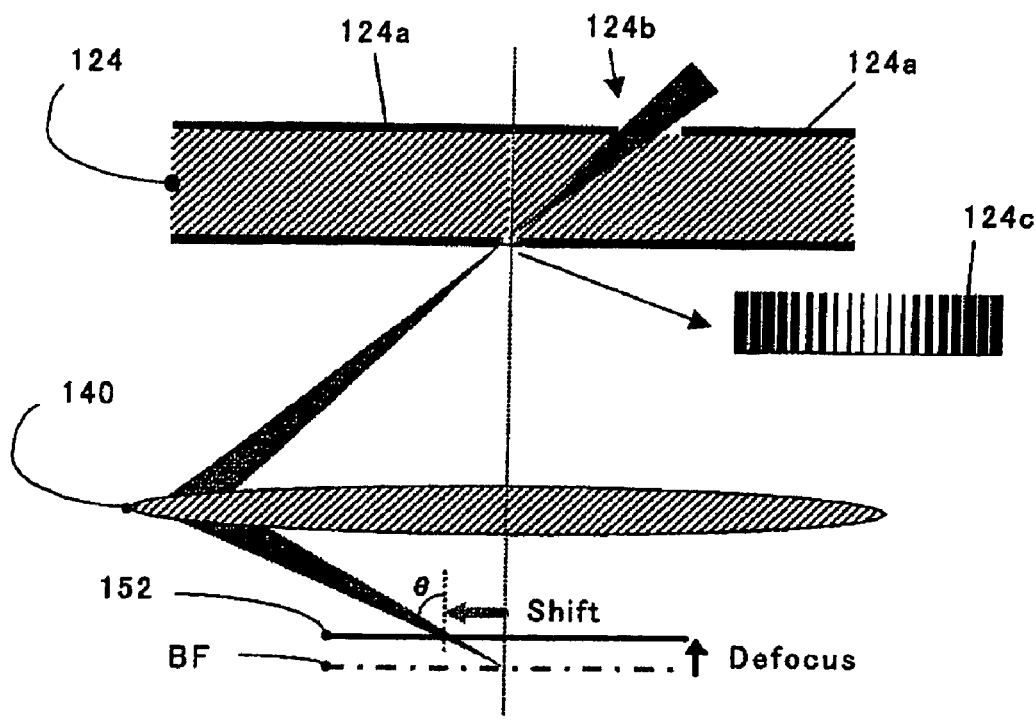
FIG. 5 is a schematic enlarged sectional diagram for explaining a Z-SPIN method applicable to the exposure method shown in FIGS. 3 and 4.

In reference to FIG. 5, according to the Z-SPIN method, an arrangement of a light shielding part 124a and an aperture 124b on the upper surface of the mask 124 (the opposite side of the test pattern formation surface) and the ring-shaped illumination guide an oblique light to the position-shifted test pattern 124c at the bottom. A special grating pattern is applied to the test pattern that controls diffractive beams. For this reason, only an oblique-incidence principal ray can be image-formed by the projection optical system 140 onto the image plane of the wafer 150. Since the principal ray is oblique, the image on the wafer 150 makes a change in position within the wafer 150's surface based on how it is focused. In other words, the image formed has its image position laterally moved (shifted) when the focus gets off to the side with respect to the image position at a best focused surface (BF). There is the relationship of tan θ=Shift/Defocus between the defocus amount (Defocus) and the position-shifting amount (Shift), where θ is an angle formed by a beam incident upon the image plane and the optical axis. Accordingly, measuring a position-sifting amount of a pattern being scanned enables a change in focus to be measured. Further, setting a pattern in a direction at right angles with the scanning direction and measuring a position-shifting amount in a similar way also enables a change in tilt of the image plane to be measured.

Figure 6A:
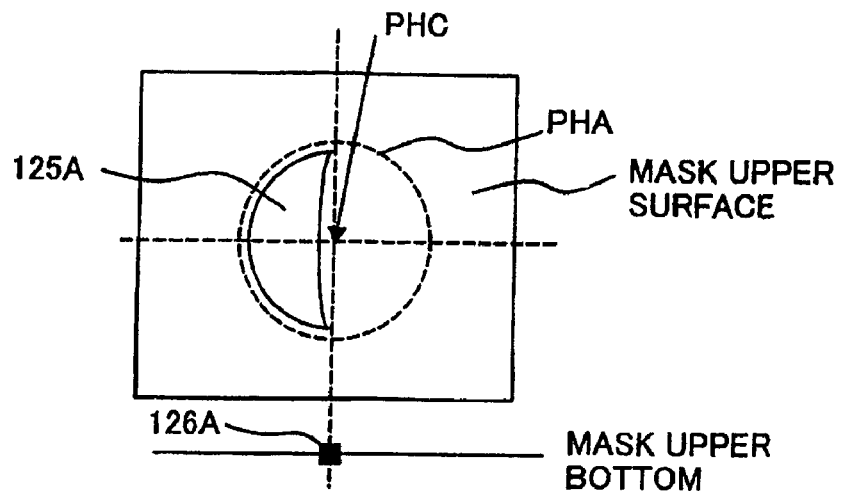
FIG. 6 is a schematic plan view showing a concrete example of an aperture and a test pattern of the mask shown in FIG. 5.

FIG. 6(a) shows a concrete example of an aperture 124b and a test pattern 124c. PHC corresponds to the center of the test pattern, and the dotted line shown by PHA corresponds to a circle with its center at PHC, the circle on which the aperture 124b is located. The gray area corresponds to the light shielding 124a.

Figure 6B:
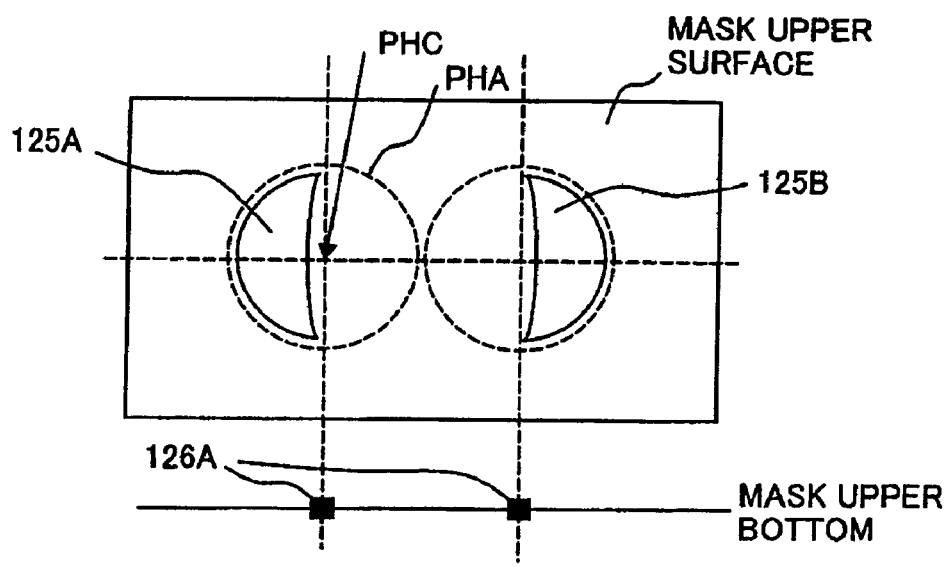

A test pattern 126A as a concrete example of the test pattern 124c is a square mark (a small-box mark) as shown in FIG. 6(b). If the line segment TPX is enlarged that makes up four sides of this square, it turns out to be a line and space in which the ratio between a light shielding part and an aperture changes like the test pattern 124c shown in FIG. 5. On the opposite surface of the test pattern 126A, there is provided an aperture 125A as a concrete example of the aperture 124b, which is exposed using a typical illumination condition (large σ) or irradiated using a scope 115. Here, σ is a filling factor, which is a value given by (illumination optical system's numerical aperture)/(projection optical system's numerical aperture).

An aperture 125 and positions within the reverse surface of the test mask are set such that an oblique-incidence illumination angle becomes nearly σ=1. The shape of the aperture 125 is set up to a sufficient extent considering the illumination intensity and scanning speed. The test pattern 126A and aperture 125A are arranged as a set at an adequate interval in a direction orthogonal to the scanning direction, and this line is also arranged on the mask at an adequate interval in the scanning direction.

Figure 6C:
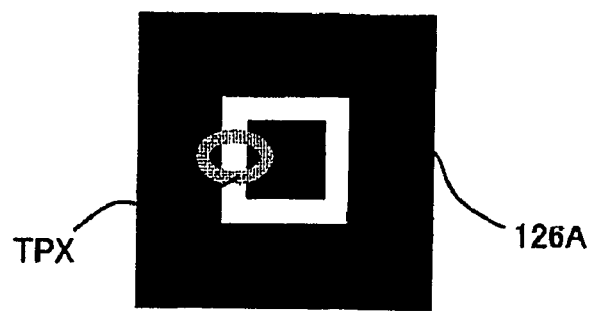

FIG. 6(c) shows a focus monitor mask as a concrete example different from FIG. 6(a). There are an aperture 125A and an aperture 125B provided in a point-symmetrical position with the test pattern 126A as a center. A difference from FIG. 6(a) is that since two apertures and two test patterns make one set, the position-shifting sensitivity to the focus change is doubled. For this reason, measurement precision is improved compared to the focus monitor mask shown in FIG. 6(a).

Figure 7A:
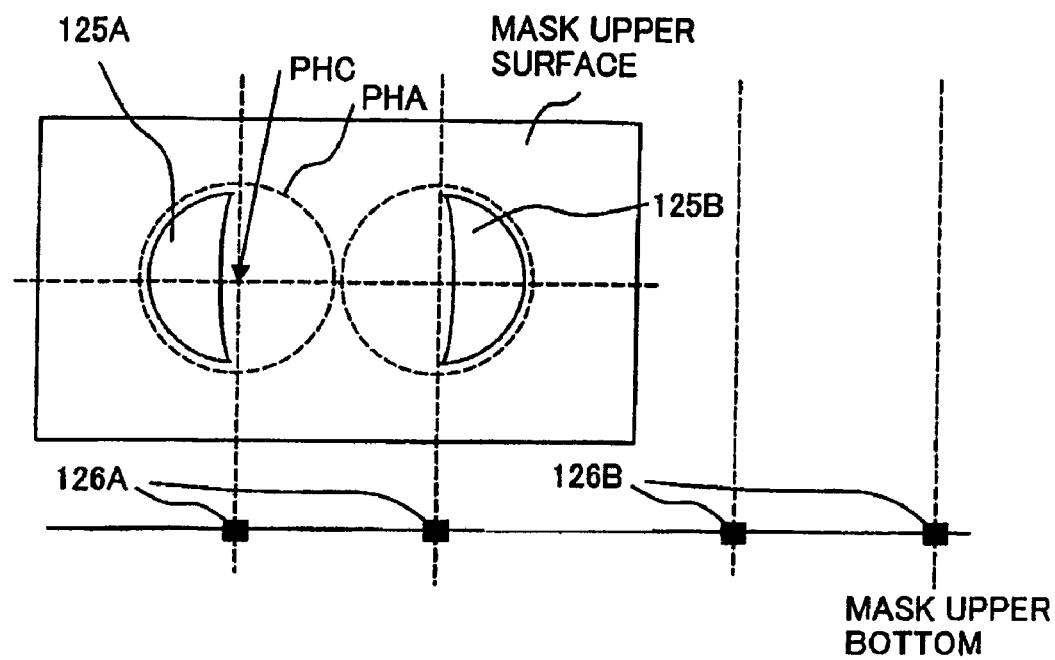
FIG. 7 is a schematic plan view showing an applied example of the mask shown in FIG. 6.

Now, referring to FIGS. 7(a) and (b), a description will be given of an application example of FIG. 6(c). FIG. 7(a) has a configuration similar to FIG. 6(c), and a set of the apertures 125A and 125B are arranged parallel to the scanning direction of the mask stage 123. On the surface side opposite to the aperture's center PHC, the test pattern 126A is arranged. In this case, the apertures 125A and 125B may be arranged at right angles with the scanning direction of the mask stage 123. The apertures 125A and 125B surrounded by the dotted lines PHA are arranged a distance of σ 1.0 or more off, and are designed such that a beam from other than the corresponding aperture does not influence the test pattern 126A. FIG. 7(a) is different from FIG. 6(c) in that the apertures are arranged at different areas (next to the apertures 126A and 126B) and have a reference mark 126B (a large-box mark), which is a square mark different in size from the test pattern 126A. A light shielding part is not needed in particular at the upper part of the reference mark 126B, and the reference mark 126B need not be a special pattern like the test pattern 30. It is assumed that the reference mark 126B of this embodiment is simply a frame mark with a width of 2 μm.

Since there is no light shielding part on the mask upper surface opposite to the reference mark 126B, the mask is illuminated not by a light whose principal beam is obliquely incident as in the case of the test pattern 126A, but by a light whose principal beam is in parallel with the optical axis of the projection optical system as in a typical exposure time. For this reason, even if a focus change arises, a projected image of the mark does not shift within the wafer surface.

Let's think about the case where the incidence angle of an illuminating light supplied from an illumination optical system is smaller than σ 1.0, and a more illumination incidence angle is needed, or a flat light source distribution is needed. An optical element such as a diffuser, CGH, and the like can be inserted into the illumination optical system, or arranged on a surface opposite to the test pattern.

Figure 7B:
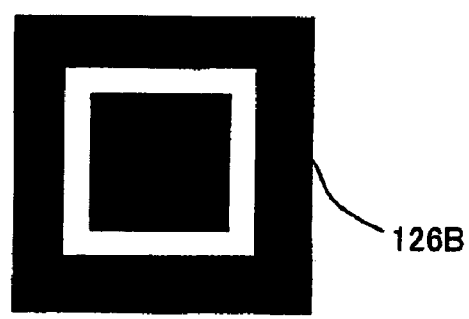

For measurement, scanning exposure is carried out twice. First, doing scanning exposure by mounting the focus monitor mask of FIG. 7 transfers a whole pattern on the focus monitor mask onto the wafer 152. Generally, the illumination condition at this time is a large σ condition. Next, the mask stage 123 is moved so as for the test pattern 126A to be positioned to the position where the reference mark 126B was. The wafer stage is also moved to such a position that the test pattern 126A's image overlaps the reference mark 126B's image, and the scanning exposure is done once again. This scanning exposure transfers the test pattern 126A and the reference mark 126B such that they overlap each other. The transferred images are developed, and the positional relationship of respective overlapped test pattern 126A (small-box mark) and reference mark 126B (large-box mark) can be found using a position-shifting finder. As to the reference mark 126B, a focus change may occur as previously mentioned, but a mark's position-shifting may not occur. On the other hand, as to the test pattern 126A, if a focus change occurs, a mark's position-shifting occurs. For this reason, the test pattern's position-shifting is measured with respect to the reference mark 126B, and a conversion by using a previously known conversion factor will enable the image plane focus condition and image plane tilt amount during scanning exposure to be found.

Figure 8:
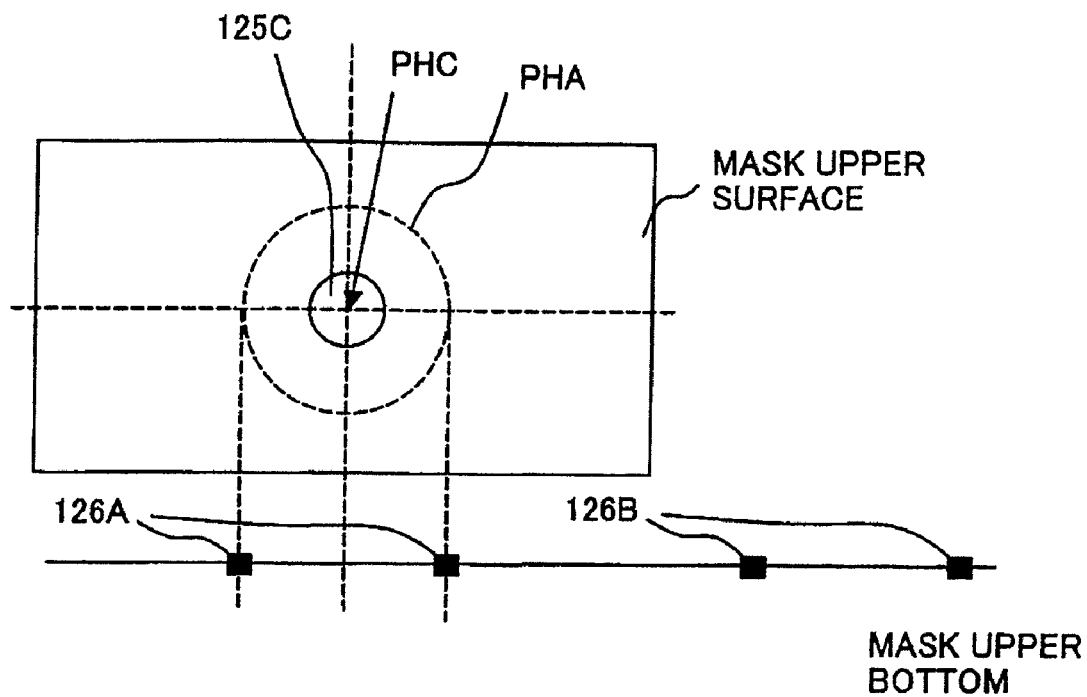
FIG. 8 is a schematic plan view showing a variation of the mask shown in FIG. 6.

In another embodiment, two test patterns 126A are arranged, as shown in FIG. 8, for one aperture 125C such that they are the same distance away from the center of the aperture 126B and yet, σ is to the inward side of 1. Similar to the embodiment shown in FIG. 7, it also becomes possible in this embodiment to do measurement by exposing the reference marks 126B such that they are overlapped over the two previous test patterns. The embodiment shown in FIG. 8 arranges a set of apertures 125C in parallel to the scanning direction of the mask stage 123, but the apertures 125C may be arranged orthogonal to the scanning direction of the mask stage 123.

So far, the description has been given of how the focus monitor mask 124 is exposed using the Z-SPIN method.

Next, referring to FIG. 4, a description will be given of the steps of exposing the actual device mask 120. Since the flowchart shown in FIG. 3 is executed prior to the flowchart shown in FIG. 4, the correction table and the offset table are stored in the memory 172. Here, FIG. 4 is a flowchart for explaining the steps of exposing the actual device mask 120.

First, mount an actual device mask 120 onto the mask stage 124 via a mask transport system (not shown) (Step 1102), and measure a mask flatness of the actual device mask at respective scan positions and optical measuring points by using the mask flatness measuring unit 130 (Step 1104). In step 1104, the flatness of the actual device mask is detected similarly to step 1004.

Next, the controller 170 calculates the actual device mask 120's deformation correction amount (Step 1106). The deformation correction amount is a difference between the value of the actual device mask 120 measured by the mask flatness measuring unit 130 and that of the focus monitor mask 124 measured by the mask flatness measuring unit 124. As the result of this, the measuring error that the mask flatness measuring unit itself has is cancelled, and so, it is simply a difference between the deformation amounts of both masks 120 and 124. So, the controller 170 calculates the pertinent mask's mask flatness by subtracting a reference offset from a measured value at each point, calculates most optimum correction amounts for the field curvature, focus, and tilt at each scanning position on the mask, and adds them to the offset table of the exposure apparatus (Step 1108). As a result, an offset to the driving amount for the driving systems designated for the focus monitor mask 124 can be converted to an offset to the driving amount for the driving systems designated for the actual device mask 120.

The controller 170 sees that the revised offset table is made available for each shot (Step 1110), and makes correction amounts available for driving the wafer and lenses at the time of scanning exposure.

In the present embodiment, the mask flatness is measured at the beginning of a production lot, and the same correction amount is made available for exposing multiple shots on the wafer.

Figures 10A, 10B:
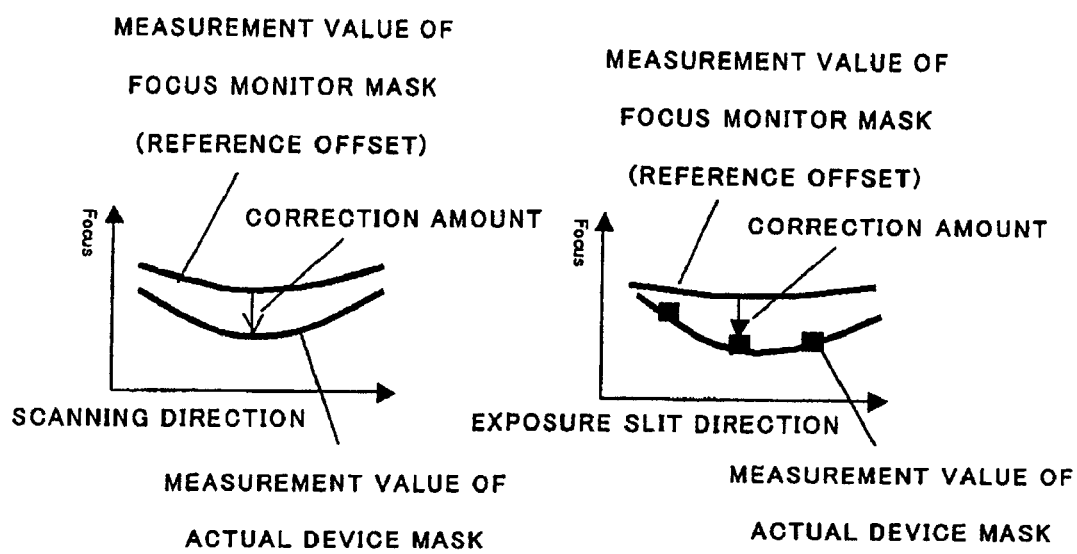
FIG. 10 is a figure showing the relationship between a measurement result by a focus monitor mask and a measurement result by an actual device mask.

FIGS. 10(a) and (b) shows the relationship of the correction amounts from the measurement result of the focus monitor mask 124 and the measurement result of the actual device mask 120. FIG. 10(a) shows the relationship between the measurement result of the mask's scanning direction and a related correction amount, and FIG. 10(b) shows the relationship between the measurement result of the exposure slit direction and a related correction amount. When strictly correcting a change of the mask flatness shape due to the exposure heat, or a change in posture of the mask stage 123, the mask flatness measurement may be done even in the course of the actual device mask 120's being scanned, and changes due to repeated scanning exposure may be corrected.

Next, expose the actual device mask 120 (Step 1112). During exposure, the illumination light from the illumination apparatus 110 illuminates the actual device mask 120 using a most optimum illumination condition. Beams having passed the mask 120 are reduced and projected under a specific magnification onto the wafer 120 by the projection optical system 140. High-precision exposure can be secured to the wafer 150 since the highly precise focus, tilt, and field curvature control has been performed based on the revised offset table. This assures that the exposure apparatus 100 performs a high-precision pattern transfer to a resist, thus making available high-grade devices (such as semiconductor devices, LCD devices, image pick-up devices (such as CCD and the like), thin-film magnetic heads, and so on).

Moreover, by calculating a difference as the correction optical system 146's offset, the difference that occurs when measuring a change in shape of the actual device mask 120, and making it available to the driving mechanism 148, correction can be performed on aberrations other than the field curvature of the projection optical system 140. For example, a spherical aberration and an astigmatism, a coma aberration, and distortion can be corrected by changing the distance between the mask surface and the final surface of the projection optical system 140. Further, when the distance differs depending on image height, which will also cause a change in field curvature and distortion. Since distortion of a mask itself can also be calculated from a measurement result, the projection optical system 140's aberrations occurring from the mask's change in shape can be corrected on the focus monitor mask 124.

Figure 11:
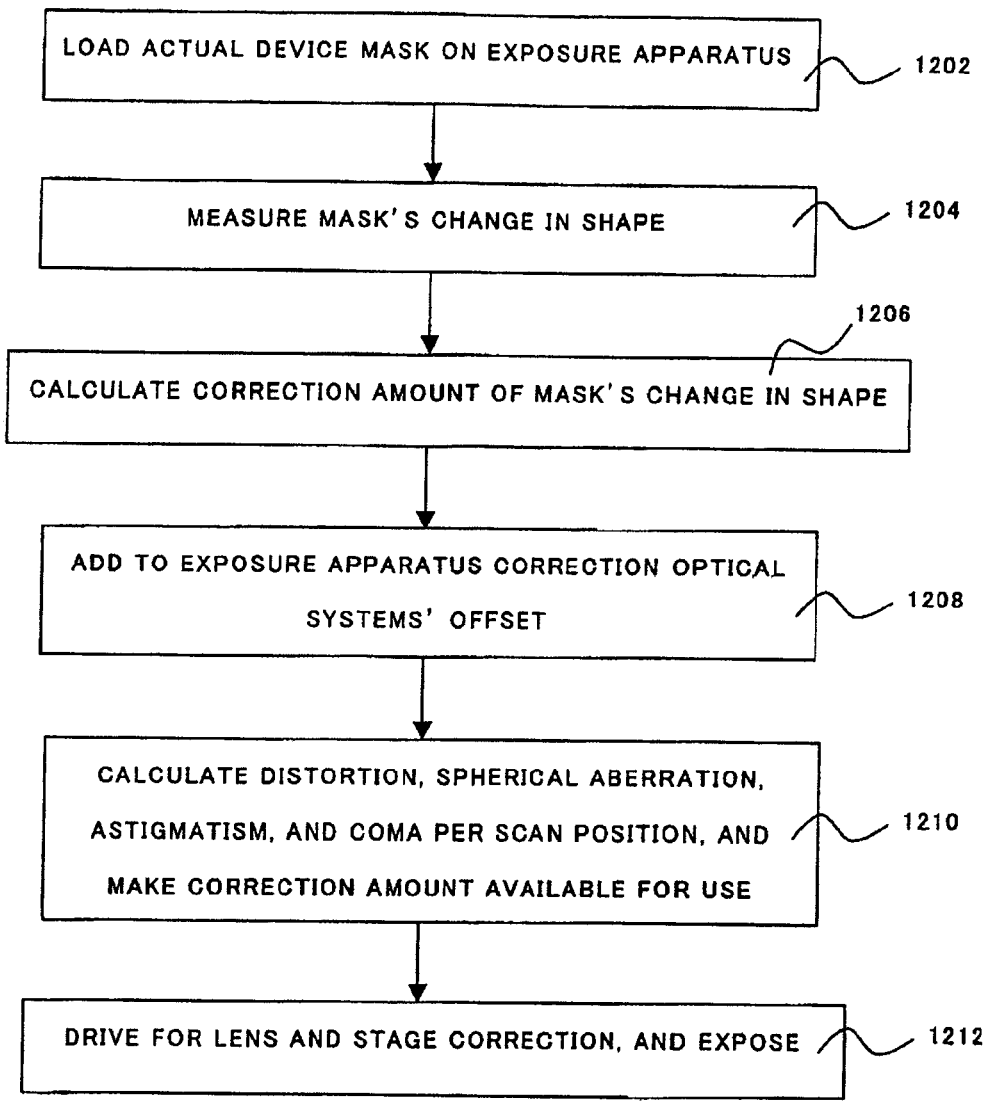
FIG. 11 is a flowchart of an exposure method different from the exposure method shown in FIGS. 3 and 4.

Referring to FIG. 11, a description will be given of these. At first, mount the actual device mask 120 on the mask stage 123 using a mask transport system (not shown) (Step 1202). Next, perform mask flatness measurement prior to the exposure operation using the mask flatness measuring unit 130 (Step 1204). Then, calculate a difference from the stored reference offset amount, and subtract the stored reference offset from the mask flatness measurement value (Step 1206). Next, calculate the mask flatness measurement result of the relevant mask about which the reference offset has been subtracted from the value measured at each point, and calculate the optimum correction amounts of a distortion, a spherical aberration, a coma aberration, and an astigmatism at each mask position. Then, add those amounts to the offset table in the memory 172 (Step 1208). Calculate the optimum correction amount for a distortion, a spherical aberration, a coma aberration, and an astigmatism for each scanning position. Then, the correction amount is made available as the correction amount for the wafer driving means and the driving means 144 and 148 of the correction optical systems 142 and 146. Then, exposure is conducted (Step 1212). In this embodiment, mask flatness measurement is performed at the beginning of a production lot, and the same correction amount is made available for exposing multiple shots on a wafer.

This embodiment has a mask flatness measurement means to handle the image plane shape and the slit direction field curvature based on an actual scanning exposure result on the focus monitor mask 124. After that, the focus monitor mask 124's flatness measurement result is stored at each measurement point as an original correction amount, and the aforementioned correction amount is manipulated using the actual device mask 120's measurement result. Calculating and correcting the actual device mask 120's flatness correction amount enables the actual device mask 120's flatness to be corrected. The present embodiment provides a high-precision exposure apparatus that rigorously controls the focus and field curvature, and other aberrations and errors.

Figure 12:
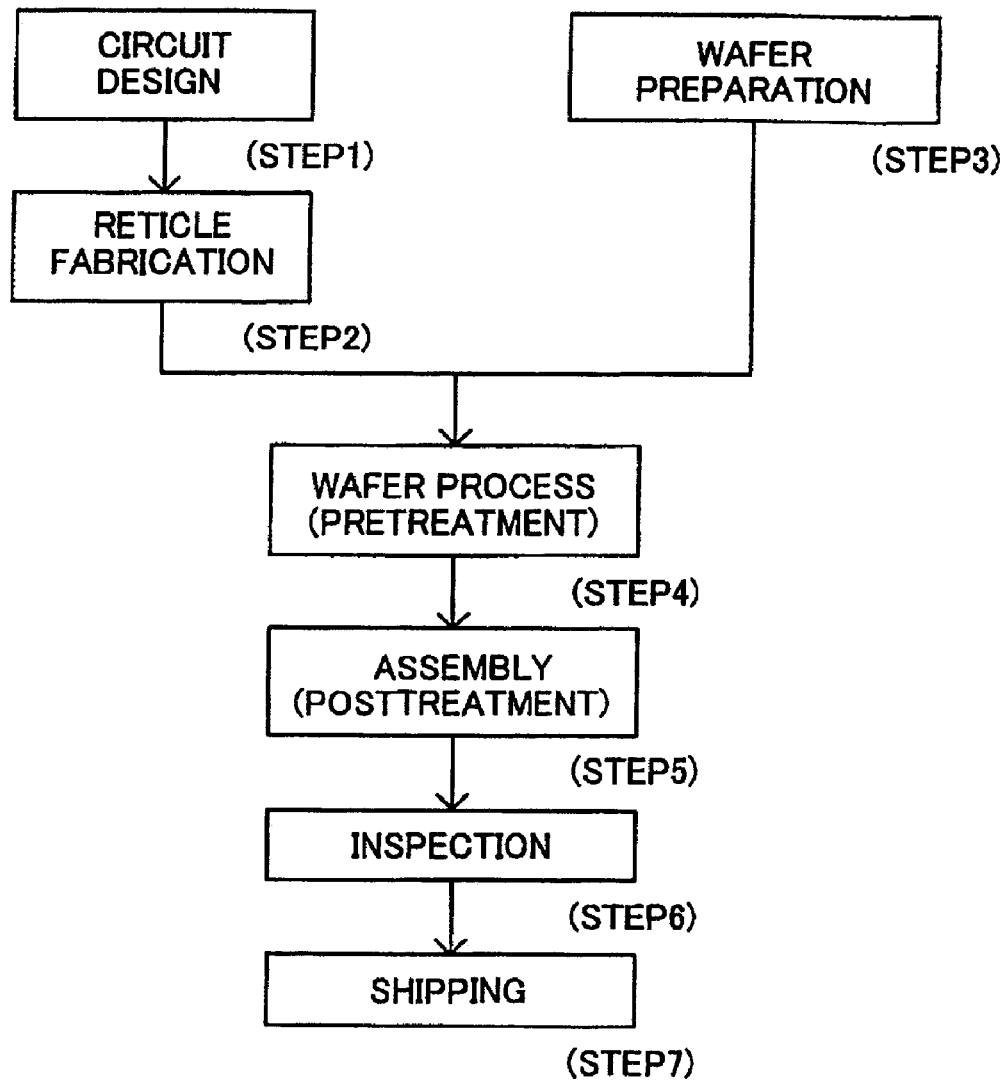
FIG. 12 is a flowchart for explaining a fabrication of devices (such as semiconductor chips like Ics, LSIs, and the like, LCD, CCD, etc.).
Figure 13:
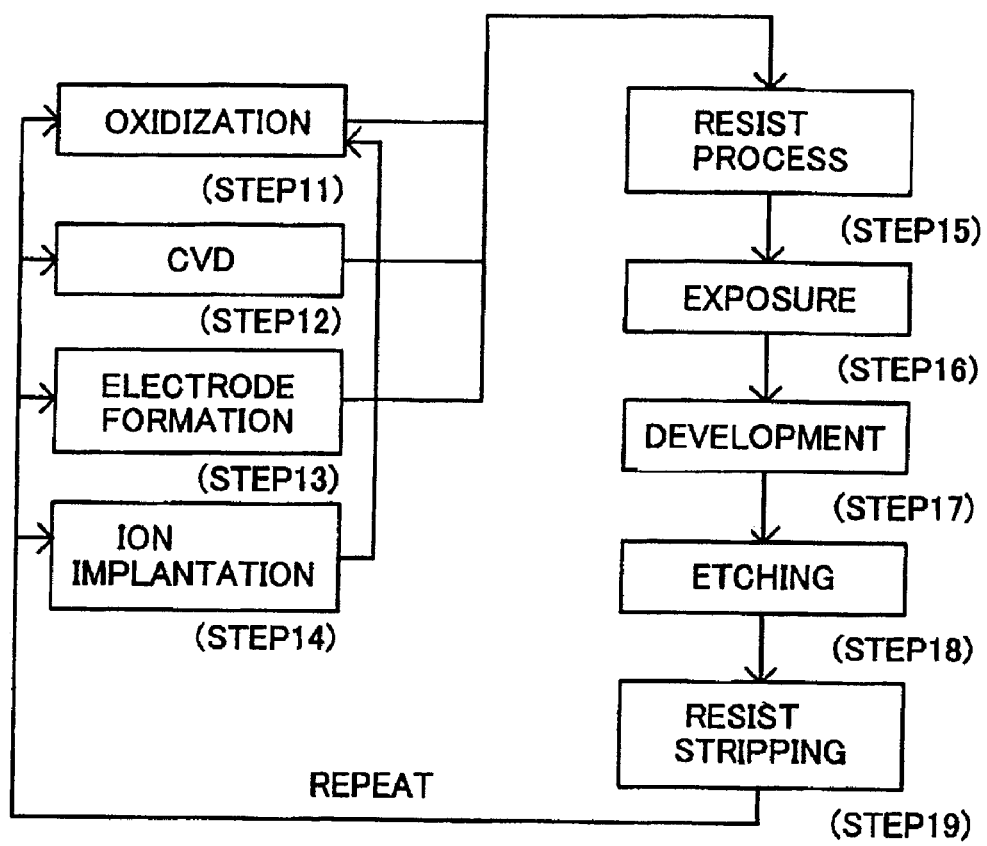
FIG. 13 is a detailed flowchart for a wafer process of Step 4 shown in FIG. 12.

Referring to FIGS. 12 and 13, a description will now be given of an embodiment of a device fabrication method using the above mentioned exposure apparatus 100. FIG. 12 is a flowchart for explaining how to fabricate devices (i.e., semiconductor chips such as IC and LSI, LCDs, CCDs). Here, a description will be given of the fabrication of a semiconductor chip as an example. Step 1 (circuit design) designs a semiconductor device circuit. Step 2 (mask fabrication) fabricates a mask suited for a designed circuit pattern. Step 3 (wafer making) manufactures a wafer using materials such as silicon. Step 4 (wafer process), which is also referred to as a pretreatment, forms actual circuitry on the wafer through photolithography of the present invention using the mask and wafer. Step 5 (assembly), which is also referred to as a posttreatment, forms into a semiconductor chip the wafer formed in step 4 and includes a assembly step (e.g., dicing, bonding), a packaging step (chip sealing), and the like. Step 6 (inspection) performs various tests for the semiconductor device made in Step 5, such as a validity test and a durability test. Through these steps, a semiconductor device is finished and shipped (Step 7).

FIG. 13 is a detailed flowchart of the wafer process in Step 4. Step 11 (oxidation) oxidizes the wafer's surface. Step 12

(CVD) forms an insulating film on the wafer's surface. Step 13 (electrode formation) forms electrodes on the wafer by vapor disposition and the like. Step 14 (ion implantation) implants ion into the wafer. Step 15 (resist process) applies a photosensitive material onto the wafer. Step 16 (exposure) uses the exposure apparatus 100 to expose a circuit pattern on the mask onto the wafer. Step 17 (development) develops the exposed wafer. Step 18 (etching) etches parts other than a developed resist image. Step 19 (resist stripping) removes disused resist after etching. These steps are repeated, and multi-layer circuit patterns are formed on the wafer. Using the device fabrication method of this embodiment enables more high-grade devices to be fabricated.

So far, a description has been given of the preferred embodiments of the present invention, but the present invention is not limited to these preferred embodiments, and various modifications and changes may be made in the present invention without departing from the spirit and scope thereof. For example, the present embodiments have employed the Z-SPIN method, but other methods such as PSFM, PGFM, and the like may be used.

This application claims a foreign priority benefit based on Japanese Patent Applications No. 2005-056198, filed on Mar. 1, 2005, which is hereby incorporated by reference herein in its entirety as if fully set forth herein.

What is claimed is:

1. An exposure method used for an exposure apparatus that exposes a pattern of a mask onto a plate by using a projection optical system, said exposure method comprising the steps of:
    obtaining information about flatness of a first mask;
    obtaining condition of an image plane when projecting a pattern of the first mask by using the projection optical system;
    obtaining information about a driving amount of a driving system in the exposure apparatus based on the condition of the image plane, which can change an imaging condition on the plate;
    obtaining information about flatness of a second mask;
    changing information about the driving amount of the driving system by using information about flatness of the first mask and the information about flatness of the second mask; and
    driving the driving system based on changed information about the driving amount of the driving system to project a pattern of the second mask onto the plate by using the projection optical system.

2. An exposure method according to claim 1, which said changing step changes information about a driving amount of the driving system based on a difference between the information about the flatness of the first mask and the information about the flatness of the second mask.

3. An exposure method according to claim 1, wherein the information about driving amount of the driving system is information about a driving amount of an optical element in the projection optical system.

4. An exposure method according to claim 1, wherein the information about driving amount of the driving system is information about a driving amount for the plate in an optical axis direction of the projection optical system.

5. An exposure method according to claim 1, wherein the exposure method projects a pattern of a mask to a plate while mutually scanning the mask and the plate, and
    wherein the information about the driving amount of the driving system includes, information about a driving amount for the plate in an optical axis direction of the projection optical system with respect to a scanning direction, and information about a driving amount of an optical element in the projection optical system with respect to a direction orthogonal to a scanning direction.

6. An exposure apparatus comprising a mode that performs an exposure method according to claim 1.

7. A device manufacturing method comprising the steps of:
    exposing a target by using the exposure apparatus according to claim 6; and
    developing the target that has been exposed.

* * * * *